(12) United States Patent
Park et al.

(10) Patent No.: US 12,430,749 B2
(45) Date of Patent: Sep. 30, 2025

(54) CELL-TO-CELL COMPARISON METHOD

(71) Applicant: NEXTIN, INC., Hwaseong-si (KR)

(72) Inventors: Tae Hoon Park, Yongin-si (KR); Junhee Jeong, Hwaseong-si (KR); Ram Segal, Nes Ziona (IL); Ehud Gabai, Talme Yafe (IL); Ella Mendelson, Ness Zionna (IL); Eyal Shamur, Raanana (IL)

(73) Assignee: NEXTIN, INC., Hwaseong-si (KR)

( * ) Notice: Subject to any disclaimer, the term of this patent is extended or adjusted under 35 U.S.C. 154(b) by 108 days.

(21) Appl. No.: 18/042,128

(22) PCT Filed: Mar. 18, 2022

(86) PCT No.: PCT/KR2022/003844
§ 371 (c)(1),
(2) Date: Feb. 17, 2023

(87) PCT Pub. No.: WO2022/220422
PCT Pub. Date: Oct. 20, 2022

(65) Prior Publication Data
US 2024/0029235 A1    Jan. 25, 2024

(30) Foreign Application Priority Data
Apr. 15, 2021    (KR) .......................... 10-2021-0048890

(51) Int. Cl.
*G06T 7/00* (2017.01)
*G06T 7/11* (2017.01)

(52) U.S. Cl.
CPC ................ *G06T 7/001* (2013.01); *G06T 7/11* (2017.01); *G06T 2207/20021* (2013.01); *G06T 2207/30148* (2013.01)

(58) Field of Classification Search
CPC . G06T 7/001; G06T 7/11; G06T 2207/20021; G06T 2207/30148;
(Continued)

(56) References Cited

U.S. PATENT DOCUMENTS 6,229,331 B1 * 5/2001 Kuwabara ............ G01R 31/311
356/237.5
7,339,663 B2    3/2008 Lim et al.
(Continued)

FOREIGN PATENT DOCUMENTS

JP    H-09-203621 A    8/1997
JP    2003-270168 A    9/2003
(Continued)

OTHER PUBLICATIONS

International Search Report of PCT/KR2022/003844, mailed Jul. 5, 2022; English translation.

*Primary Examiner* — Aaron W Carter
(74) *Attorney, Agent, or Firm* — DICKINSON WRIGHT PLLC

(57) ABSTRACT

A cell-to-cell comparison method for inspecting a defect in a subject in which unit cells that may be expressed by a two-dimensional (2D) vector are periodically arranged according to an embodiment of the present invention includes: obtaining an image of the subject including an array of the unit cells; generating a tile that is a set of pixels corresponding to the same position in a plurality of unit cells within the array in the image; determining a gray level of each of a plurality of pixels within the tile; and determining whether the plurality of pixels within the tile are defective on the basis of the determined gray level of each of the plurality of pixels.

8 Claims, 3 Drawing Sheets

(58) Field of Classification Search
CPC .... G06T 7/0006; G06V 10/75; G06V 10/751; H01L 22/00; H01L 22/12
See application file for complete search history.

(56) References Cited

U.S. PATENT DOCUMENTS

| | | | |
|---|---|---|---|
| 8,184,899 B2 * | 5/2012 | Yang | G06T 7/0004 382/149 |
| 9,066,408 B2 * | 6/2015 | Choi | G09G 3/006 |
| 9,070,014 B2 * | 6/2015 | Amzaleg | G06T 7/001 |
| 2004/0028267 A1 * | 2/2004 | Shoham | G06T 7/001 382/141 |
| 2004/0057611 A1 * | 3/2004 | Lee | G03F 7/7065 382/145 |
| 2004/0141640 A1 * | 7/2004 | Lee | G06T 7/0004 382/149 |
| 2004/0146295 A1 * | 7/2004 | Furman | G01N 21/95607 398/9 |
| 2004/0150813 A1 * | 8/2004 | Kim | G01N 21/9501 356/237.1 |
| 2005/0152594 A1 * | 7/2005 | Jau | H01L 21/67288 382/145 |
| 2006/0012782 A1 * | 1/2006 | Lim | G01N 21/95607 356/237.5 |
| 2006/0078191 A1 * | 4/2006 | Matsumura | G01N 21/8851 382/149 |
| 2006/0222232 A1 * | 10/2006 | Ishikawa | G06T 7/0004 382/141 |
| 2009/0238445 A1 * | 9/2009 | Yang | G06T 7/0004 382/149 |
| 2011/0164129 A1 | 7/2011 | Postolov et al. | |
| 2011/0280470 A1 * | 11/2011 | Hayashi | G06T 7/001 382/149 |
| 2017/0003230 A1 * | 1/2017 | Park | G01N 21/9501 |
| 2019/0130552 A1 * | 5/2019 | Sohn | G03F 7/7065 |
| 2024/0029235 A1 * | 1/2024 | Park | G06V 10/75 |

FOREIGN PATENT DOCUMENTS

| | | |
|---|---|---|
| JP | 2005-150727 A | 6/2005 |
| KR | 10-2005-0045892 A | 5/2005 |
| KR | 10-2006-0005517 A | 1/2006 |
| KR | 10-2008-0056149 A | 6/2008 |
| KR | 10-2008-0061938 A | 7/2008 |

* cited by examiner

CELL-TO-CELL COMPARISON METHOD

CROSS-REFERENCE TO RELATED APPLICATIONS

This application is a 35 U.S.C. § 371 national phase of PCT International Application No. PCT/KR2022/003844, filed Mar. 18, 2022, which claims the benefit of priority under 35 U.S.C. § 119 to Korean Patent Application No. 10-2021-0048890, filed Apr. 15, 2021, the contents of which are incorporated herein by reference in its entirety.

TECHNICAL FIELD

The present invention relates to a cell-to-cell comparison method, and more particularly, to a method for inspecting a defect in a subject in which unit cells that may be expressed by a two-dimensional vector are periodically arranged.

BACKGROUND

The statements in this section merely provide background information related to the present disclosure and may not constitute prior art.

In general, a semiconductor device is manufactured by repeatedly performing unit processes such as film formation, etching, and metal wiring to form a fine pattern having electrical characteristics on a semiconductor substrate.

As such a semiconductor device is highly integrated and processes are performed at a high speed, defects are thoroughly inspected in a manufacturing stage. This is because a partial defect in a fine pattern is directly related to a defect in a semiconductor device.

The defect in the semiconductor device is detected by a difference between a gray level of a defect detection target area and a gray level of an adjacent equivalent area of the defect detection target area after creating a gray level in a wafer. That is, defect inspection is performed by comparing gray levels of two areas.

In the case of a defect inspection method through such comparison, there is a problem in that noise such as pattern discoloration or pattern lightening, which does not affect a semiconductor yield, is also detected during defect detection. As a result, it is necessary to estimate noise in the defect detection target area in order to calculate a signal-to-noise ratio (SNR) that distinguishes a gray level according to defect and a gray level due to noise.

However, noise estimation may not be accurate, which may adversely affect the reliability of defect detection results. Therefore, it is required to develop a more reliable comparison method in defect inspection of a semiconductor device through comparison.

SUMMARY

The present invention provides a cell-to-cell comparison method for comparing an inspection area of an inspection target unit cell with corresponding areas of a plurality of unit cells at the same position in order to inspect a defect in a subject in which unit cells are periodically arranged.

A cell-to-cell comparison method for inspecting a defect in a subject in which unit cells that may be expressed by a two-dimensional (2D) vector are periodically arranged according to an embodiment of the present invention may include obtaining an image of the subject including an array of the unit cells; generating a tile that is a set of pixels corresponding to the same position in a plurality of unit cells within the array in the image; determining a gray level of each of a plurality of pixels within the tile; and determining whether the plurality of pixels within the tile are defective on the basis of the determined gray level of each of the plurality of pixels.

The determining of whether the plurality of pixels within the tile are defective may include comparing a degree at which a gray level of a pixel for which it is to be determined whether it is currently defective among the plurality of pixels within the tile deviates (disperses) from an average of gray levels of pixels other than the pixel for which it is to be determined whether it is currently defective among the plurality of pixels within the tile with a specified threshold value.

The determining whether the plurality of pixels within the tile are defective may use a gray level of a pixel for which it is to be determined whether it is currently defective among the plurality of pixels within the tile, and an average and standard deviation of gray levels of pixels other than the pixel for which it is to be determined whether it is currently defective among the plurality of pixels within the tile.

The determining of whether the plurality of pixels within the tile are defective may include obtaining the average and the standard deviation of gray levels of pixels other than the pixel for which it is to be determined whether it is currently defective among the plurality of pixels within the tile.

The determining of whether the plurality of pixels within the tile are defective may further include calculating an absolute value of a difference between the gray level of the pixel for which it is to be determined whether it is currently defective among the plurality of pixels within the tile and the average.

The determining of whether the plurality of pixels within the tile are defective may further include dividing the absolute value by the standard deviation.

The determining of whether the plurality of pixels within the tile are defective may further include comparing a value obtained by dividing the absolute value by the standard deviation with a specified threshold value.

The cell-to-cell comparison method may further include displaying a defect result of determining whether the plurality of pixels within the tile are defective.

In the determining of the gray level of each of the plurality of pixels within the tile, the determined gray level may include noise.

The cell-to-cell comparison method according to the present invention compares an inspection area of an inspection target unit cell with corresponding areas of a plurality of unit cells at the same position in a one-to-many correspondence, thereby improving the reliability of defect inspection of a subject.

In addition, the cell-to-cell comparison method according to the present invention compares an inspection area of an inspection target unit cell with statistical values of corresponding areas of a plurality of unit cells at the same position, and thus an additional operation of estimating noise in determining a defect in a subject is omitted.

The effects obtainable in the present invention are not limited to the effects mentioned above, and other effects not mentioned will be clearly understood by those skilled in the art from the description below.

The drawings described herein are for illustration purposes only and are not intended to limit the scope of the present disclosure in any way.

DETAILED DESCRIPTION

Terms such as "unit", "device", and "system" described throughout this specification refer to a unit that processes an operation in which one or more functions are combined, which may be implemented in hardware, software, or a combination of hardware and software.

Terms such as "unit", "device", and "system" as used this specification may be treated as equivalent to a computer-related entity, that is, hardware, a combination of hardware and software, software, or software in execution. In addition, an application program executed in the present invention may be configured in units of "unit", and may be recorded in one physical memory in readable, writable, and erasable form, or may be recorded in a distributed manner between two or more memories or recording media.

The terms used in this specification are terms defined in consideration of the functions of the present invention, which may vary according to the intention or practice of a user or operator. Therefore, definitions of these terms should be made based on the description throughout this specification.

In addition, the embodiments disclosed below do not limit the scope of the present invention, but are merely examples of the components presented in the claims of the present invention, and embodiments included in the technical spirit throughout the specification of the present invention and including components that may be replaced as equivalents in the components of the claims may be included in the scope of the present invention.

In the embodiments disclosed below, terms such as "first", "second", "one side", and "other side" are used to distinguish one component from another component, and the component is not limited by the above terms.

Hereinafter, embodiments of the present invention will be described in detail with reference to the accompanying drawings. In describing the present invention, detailed descriptions of known technologies that may obscure the gist of the present invention will be omitted.

Figure 1:
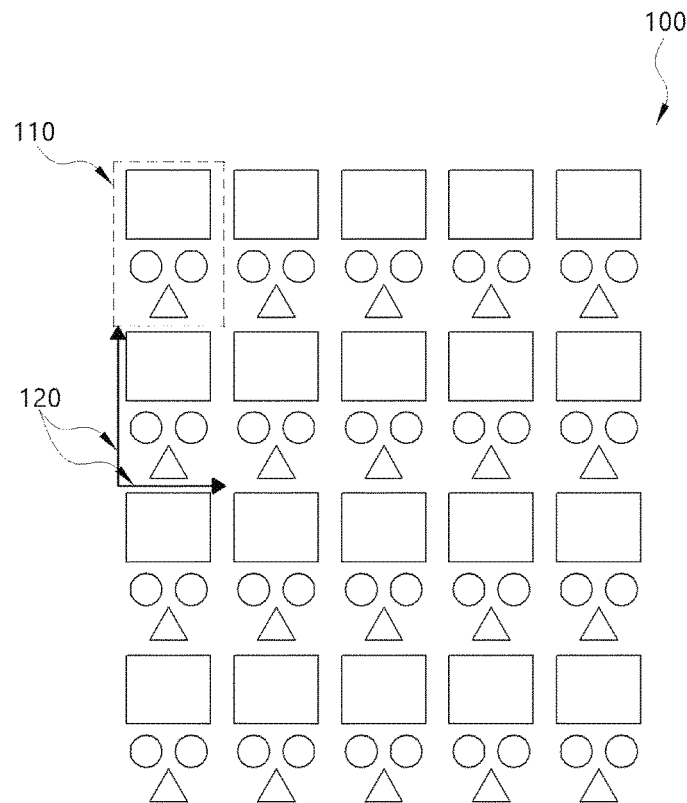
FIG. 1 is an example of a subject that is a defect inspection target through a cell-to-cell comparison method according to an embodiment of the present invention.

FIG. 1 is an example of a subject that is a defect inspection target through a cell-to-cell comparison method according to an embodiment of the present invention.

Referring to FIG. 1, a subject 100 that is the defect inspection target through the cell-to-cell comparison method according to an embodiment of the present invention has a structure in which unit cells 110 that may be expressed by a two-dimensional (2D) vector 120 are periodically arranged. As shown, the subject 100 may have a structure in which the unit cells 110 engraved with the same fine pattern are arranged in a matrix form on a wafer. Examples of the subject 100 include a semiconductor wafer, an image sensor, and a display panel.

The subject 100 is mainly a semiconductor device, and is inspected whether the subject 100 is defective during a manufacturing process or prior to shipment. The subject 100 includes a fine pattern formed on a substrate or a wafer through various processes such as doping, thermal oxidation, deposition, etching, and exposure. Since the subject 100 has the characteristic in which the same fine patterns are repeatedly arranged, by comparing a unit cell in which the same fine patterns are bundled into one unit and a unit cell adjacent thereto, an abnormality or a defect of the fine pattern in the subject 100 is detected.

In the present invention, one unit cell in the subject 100 and several other unit cells in the subject 100 excluding one unit cell are compared in detecting an abnormality or a defect of the fine pattern in the subject 100.

As shown, the subject 100 includes the unit cells 110 having the same fine pattern, and the unit cells 110 are periodically arranged on a plane. The unit cell 110 is represented by a 2D vector having a position value with respect to a first axis and a second axis perpendicular to the first axis. The first axis and the second axis are on the same plane.

Figure 2:
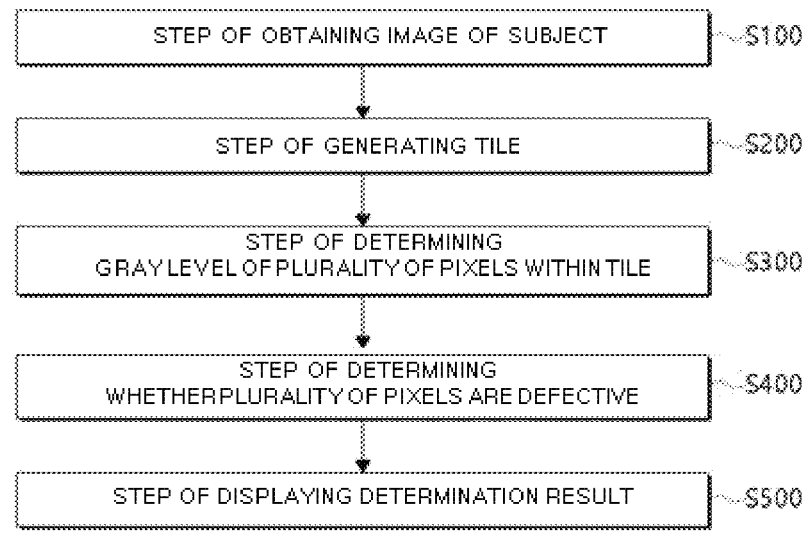
FIG. 2 is a flowchart of a cell-to-cell comparison method according to an embodiment of the present invention.
Figure 3:
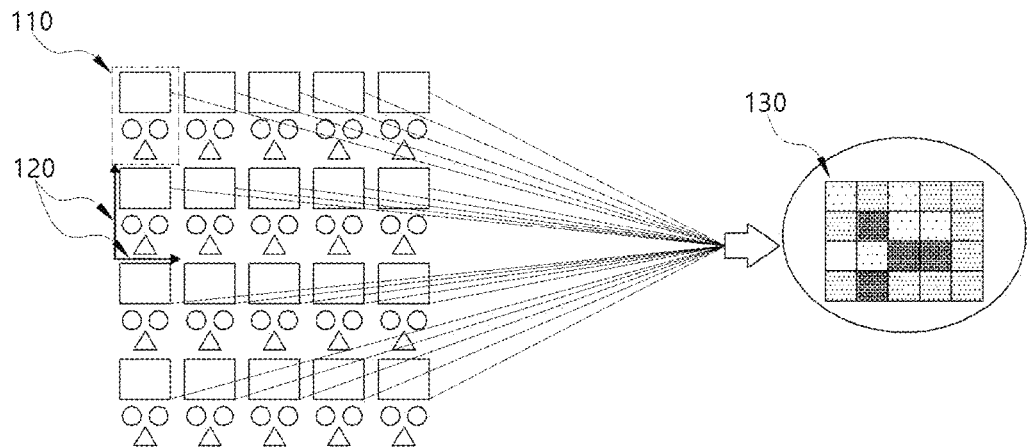
FIG. 3 is a diagram explaining a principle of generating a tile in a cell-to-cell comparison method according to an embodiment of the present invention.

FIG. 2 is a flowchart of a cell-to-cell comparison method according to an embodiment of the present invention. FIG. 3 is a diagram explaining a principle of generating a tile in a cell-to-cell comparison method according to an embodiment of the present invention.

Referring to FIG. 2, the cell-to-cell comparison method of the present invention is for inspecting a defect in a subject in which unit cells that are expressed by a 2D vector are periodically arranged, and includes a step of obtaining an image of the subject (S100), a step of generating a tile (S200), a step of determining a gray level of a plurality of pixels within the tile (S300), a step of determining whether the plurality of pixels within the tile are defective (S400), and a step of displaying a determined result (S500).

According to the present invention, semiconductor device manufacturing equipment proceeds a wafer according to a process and a camera of a defect inspection system photographs the wafer, and processing of a photographing result or the steps of the present invention is automatically performed through hardware provided in the defect inspection system for image processing or a processor executing an embedded program. In addition, the results obtained in each step of the present invention are automatically stored and used for the next step. Even if not separately mentioned below, it is necessary to understand the description in consideration of these matters.

In step S100, the image of the subject 100 is obtained. In an embodiment, the image of the subject 100 may be obtained through an imaging device of a defect inspection system to be described below. The image of the subject obtained in step S100 may be an actual image that is externally expressed as shown in FIG. 3 but may be a set of image data including position information of each of the pixels and brightness information of the pixel when the pixels which a basic unit of an image form a 2D matrix.

Referring to FIG. 3, the image of the subject 100 reflects the subject including a structure in which the unit cells 110 which may be expressed by the 2D vector 120 are periodically arranged, that is, an array of unit cells and also reflects a defect in the subject.

In step S200, the tile, which is a set of pixels corresponding to the same position of a plurality of unit cells in the array of unit cells in the image obtained in step S100, is generated. Generating a tile means a classification operation of forming a bundle of pixels corresponding to the same coordinate point of a 2D vector of each unit cell in order to compare unit cells with each other for defect detection. Here, each of the pixels corresponding to the same coordinate point of the 2D vector of each unit cell included in the image of the subject is an element constituting the tile, and at the same time is a basic unit of cell-to-cell comparison.

In an embodiment, the number of tiles generated in step S200 is equal to the number of pixels constituting an image of one unit cell. However, the number of tiles may exceed or fall short of the number of pixels constituting an image of one unit cell as needed.

Referring to FIG. 3, a tile 130, which is a bundle of pixels corresponding to the same coordinate point of the 2D vector of the plurality of unit cells in the image of the subject, is enlarged and shown. In the illustrated embodiment, one tile 130 includes 20 pixels respectively separated from 20 unit cells.

In step S300, the gray level of each of the plurality of pixels within the tile 130 generated in step S200 is determined. That is, the plurality of pixels within the tile 130 have position information and brightness information of the image of the subject, and the gray level is determined by the brightness information.

At this time, an analog image signal in which an intensity of light reflected or scattered at the corresponding position of the subject is converted into a current appears, and the analog image signal is again converted into a digital image signal by an ADC, so that the gray level, which is the brightness information of the plurality of pixels, is formed.

In addition, since the size of a 2D vector of a unit cell is not necessarily an integer multiple of a pixel, when determining the gray level of each of the plurality of pixels within the tile, the gray level may be calculated by interpolation of adjacent pixels.

All of the plurality of pixels included in one tile 130 are expected to include the same image information of the same position of the unit cell in the subject. Therefore, it is expected that the gray level of each of the plurality of pixels included in one tile 130 is equal. However, each of gray levels of the plurality of pixels included in one tile 130 is not determined only by the surface shape of the subject at the corresponding position, but has different values due to a defect occurring in the subject, a difference in the amount of exposure light at the time of photographing, noise generated while being converted into an electrical signal, discoloration unrelated to a semiconductor yield, or noise caused by a grain.

In step S400, it is determined whether the plurality of pixels within the tile are defective based on the gray level of each of the plurality of pixels within the tile determined in step S300.

The gray level of the pixel corresponding to the defective area will be significantly different from the gray level of other pixels within the tile. Based on this, in step S400, by comparing a degree to which a gray level of a pixel to be determined whether to be currently defective among the plurality of pixels within the tile is dispersed from the average of gray levels of pixels other than the pixel to be determined for whether to be currently defective among the plurality of pixels within the tile with a specified threshold value, it is determined whether the pixel for which it is to be determined whether it is currently defective is defective.

More specifically, in step S400, the gray level of the pixel for which it is to be determined whether it is currently defective among the plurality of pixels within the tile, and the average and standard deviation of gray levels of pixels other than the pixel for which it is to be determined whether it is currently defective among the plurality of pixels within the tile are used. Thus, in determining whether one unit cell is defective, one unit cell and a plurality of unit cells having the same surface shape as the one unit cell may be compared with each other, thereby improving the reliability of defect detection. In addition, in determining whether one unit cell is defective, by using the standard deviation of gray levels of pixels other than the pixel to be determined for whether to be currently defective, an operation of estimating noise for removing an increase in the gray level in which the noise is reflected may be omitted.

Figure 4:
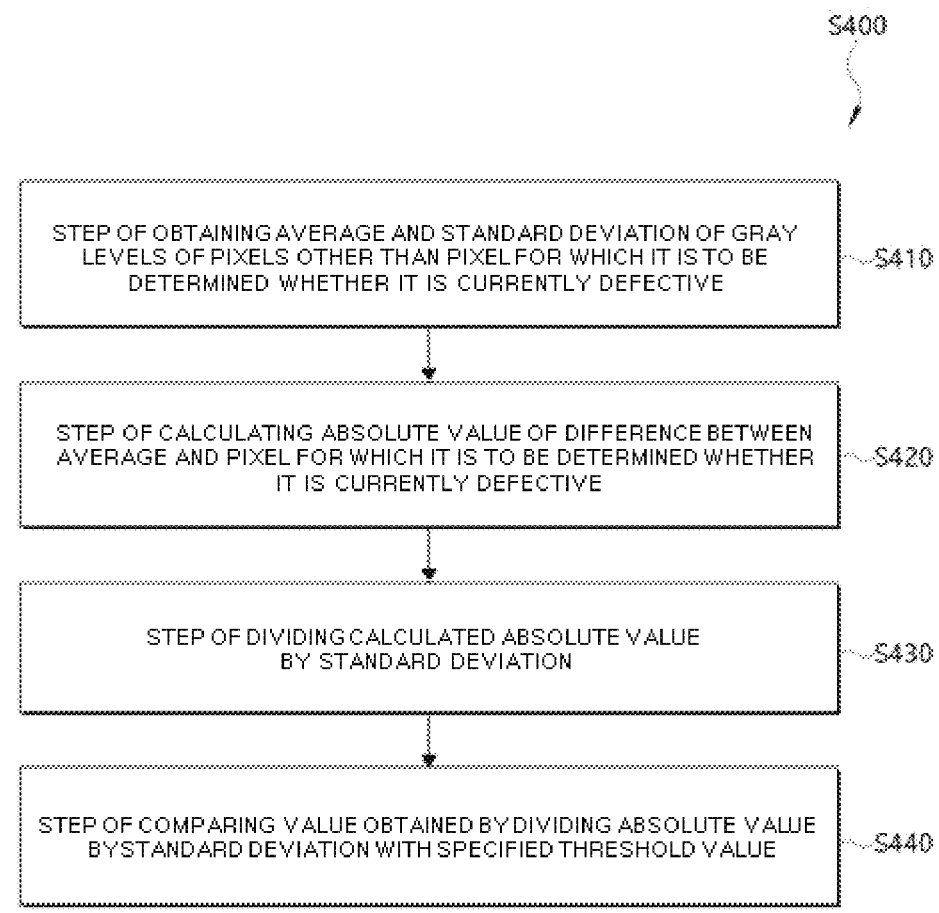
FIG. 4 is a flowchart of a method for determining a defect in a cell-to-cell comparison method according to an embodiment of the present invention.

FIG. 4 is a flowchart of a method for determining a defect in a cell-to-cell comparison method according to an embodiment of the present invention.

Referring to FIG. 4, in the cell-to-cell comparison method according to an embodiment of the present invention, step S400 of determining whether the plurality of pixels within the tile are defective includes step S410 of obtaining the average and standard deviation of gray levels of pixels other than the pixel for which it is to be determined whether it is currently defective, step S420 of calculating an absolute value of a difference between the average and the gray level of the pixel for which it is to be determined whether it is currently defective, step S430 of dividing the calculated absolute value by the standard deviation, and step S440 of comparing a value obtained by dividing the absolute value by the standard deviation with a specified threshold value.

In step S410, the average and standard deviation of gray levels of pixels other than the pixel for which it is to be determined whether it is currently defective among the plurality of pixels within the tile are obtained.

In step S420, the absolute value obtained by subtracting the average of gray levels of pixels other than the pixel for which it is to be determined whether it is currently defective among the plurality of pixels within the tile obtained in step S410 from the gray level of the pixel for which it is to be determined whether it is currently defective among the plurality of pixels within the tile is calculated. This is because the pixel for which it is to be determined whether it is currently defective is expected to have a defect when a brightness level of the pixel for which it is to be determined whether it is currently defective is significantly higher or lower than a brightness level of each of a plurality of other pixels in the same tile.

In step S430, the absolute value calculated in step S420 is divided by a standard deviation of gray levels of pixels other than the pixel for which it is to be determined whether it is currently defective among the plurality of pixels within the tile obtained in step S410. That is, a ratio of a degree at which the gray level of the pixel for which it is to be determined whether it is currently defective deviates from the average of gray levels with respect to the standard deviation of gray levels of pixels other than the pixel for which it is to be determined whether it is currently defective among the plurality of pixels within the tile is obtained.

In step S440, the value obtained by dividing the absolute value by the standard deviation in step S430 is compared with the specified threshold value. When the value obtained by dividing the absolute value by the standard deviation is greater than or equal to the specified threshold value, an area of the subject corresponding to a pixel for which it is to be determined whether it is currently detected is determined to be defective, and when the value obtained by dividing the absolute value by the standard deviation is less than the specified threshold value, the area of the subject corresponding to the pixel for which it is to be determined whether it is currently detected is determined to be normal. That is, through comparison in step S440, when the degree at which the gray level of the pixel for which it is to be determined whether it is currently defective deviates from the average of gray levels is large, the area of the subject corresponding to the pixel for which it is to be determined whether it is currently detected is determined to be defective, and when the degree is not large, the area of the subject corresponding to the pixel for which it is to be determined whether it is currently detected is determined to be normal.

The specified threshold value may be previously specified as a certain value before step S400 is performed and stored in a storage medium, and then used for defect determination. In addition, the specified threshold value may be specified as a different value according to the tile.

In step S500, a result of whether the plurality of pixels are defective determined in step S400 is displayed. Through this step, the operator may determine whether the subject is defective and the position of the defect.

Figure 5:
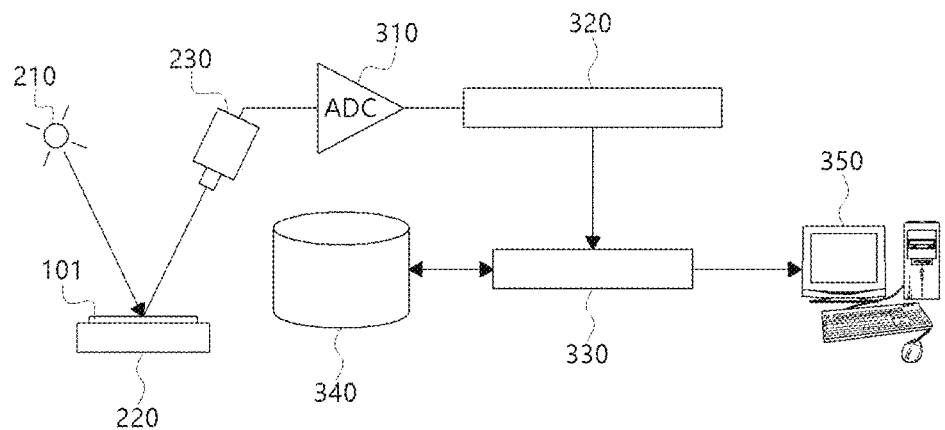
FIG. 5 is a schematic configuration diagram of a defect detection system performing a cell-to-cell comparison method according to an embodiment of the present invention.

FIG. 5 is a schematic configuration diagram of a defect detection system performing a cell-to-cell comparison method according to an embodiment of the present invention.

Referring to FIG. 5, the defect detection system performing the cell-to-cell comparison method according to an embodiment of the present invention includes an imaging device, an image processing device, and a display device. The defect detection system detects whether a subject 101 in which unit cells expressed by a 2D vector are periodically arranged is defective and the position of the defect, and displays a defect result.

The imaging device includes a light source 210, a stage 220, and a camera 230, and obtains an image of the subject by irradiating light emitted from the light source 210 to a partial area of the subject 101 moving according to the operation of the stage 220, collecting light reflected or scattered from the subject, and detecting the light in a focal plane. That is, the imaging device performs step S100 described above.

The image processing device includes an ADC 310, a data processing module 320, a determination module 330, and a storage medium 340. The ADC 310 converts an analog image signal obtained by converting an intensity of light reflected or scattered by the camera 230 into a current into a digital image signal.

The data processing module 320 receives the digital image signal and performs parts of steps S200 to S400 described above using the digital image signal.

The data processing module 320 generates a tile, which is a set of pixels corresponding to the same position of a plurality of unit cells in an array of unit cells in the image obtained by the imaging device. In this case, the data processing module 320 may later process the digital image signal in parallel for each of a plurality of tiles.

The data processing module 320 determines a gray level of each of a plurality of pixels in the generated tile 130. That is, the plurality of pixels within the tile 130 have position information and brightness information of the image of the subject, and a gray level is determined by the brightness information. Since the size of a 2D vector of a unit cell is not necessarily an integer multiple of a pixel, when the data processing module 320 determines the gray level of each of the plurality of pixels within the tile, the gray level may be calculated by interpolation of adjacent pixels.

In addition, the data processing module 320 obtains the average and standard deviation of gray levels of pixels other than a pixel for which it is determined whether it is currently defective within the tile, calculates an absolute value of a difference between the average and the gray level of the pixel to be determined for whether to be currently defective, and performs an operation of dividing the calculated absolute value by the standard deviation. That is, the data processing module 320 automatically performs steps S410 to S430 described above.

In addition, the data processing module 320 transmits data generated in the image processing process to the storage medium 340 and transmits a value obtained by dividing the calculated absolute value by the standard deviation to the determination module 330.

The determination module 330 may compare the value received from the data processing module 320 with a specified threshold value previously stored in the storage medium 340 to determine whether the subject is defective and the position of the defect. That is, when the value received from the data processing module 320 is greater than or equal to a specified threshold value, the determination module 330 determines that an area of a pixel for which it is determined whether it is currently defective is defective, and when the value received from the data processing module 320 is less than the specified threshold value, the determination module 330 determines that the area of the pixel for which it is determined whether it is currently defective is normal.

In addition, the determination module 300 transmits a result of whether a plurality of pixels of the subject are defective to the display device 350, and the display device displays whether the subject is defective and information about the position of the defect. Through the display device 350, the operator may determine whether the subject is defective and the position of the defect.

Although the embodiments of the present invention have been described with reference to the accompanying drawings, those skilled in the art will understand that the present invention may be embodied in other specific forms without changing its technical spirit or essential features. Therefore, it should be understood that the embodiments described above are illustrative in all respects and not restrictive.

The invention claimed is:

1. A cell-to-cell comparison method for inspecting a defect in a subject in which unit cells that are expressed by a two-dimensional (2D) vector are periodically arranged, the cell-to-cell comparison method comprising:
   obtaining an image of the subject including an array of the unit cells;
   generating a tile that is a set of pixels corresponding to a same position in a plurality of unit cells within the array in the image;
   determining a gray level of each of a plurality of pixels within the tile; and
   determining whether the plurality of pixels within the tile are defective on the basis of the determined gray level of each of the plurality of pixels,
   wherein the determining of whether the plurality of pixels within the tile are defective includes: comparing a degree at which a gray level of a pixel for which it is to be determined whether it is currently defective among the plurality of pixels within the tile deviates from an average of gray levels of pixels other than the pixel to be determined for whether to be currently defective among the plurality of pixels within the tile with a specified threshold value.

2. The cell-to-cell comparison method of claim 1, wherein the determining of whether the plurality of pixels within the tile are defective uses a gray level of a pixel for which it is to be determined whether it is currently defective among the plurality of pixels within the tile, and an average and standard deviation of gray levels of pixels other than the pixel to be determined for whether to be currently defective among the plurality of pixels within the tile.

3. The cell-to-cell comparison method of claim 2, wherein the determining of whether the plurality of pixels within the tile are defective includes: obtaining the average and the standard deviation of gray levels of pixels other than the pixel for which it is to be determined whether it is currently defective among the plurality of pixels within the tile.

4. The cell-to-cell comparison method of claim 3, wherein the determining of whether the plurality of pixels within the tile are defective further includes: calculating an absolute value of a difference between the gray level of the pixel for which it is to be determined whether it is currently defective among the plurality of pixels within the tile and the average.

5. The cell-to-cell comparison method of claim 4, wherein the determining of whether the plurality of pixels within the tile are defective further includes: dividing the absolute value by the standard deviation.

6. The cell-to-cell comparison method of claim 4, wherein the determining of whether the plurality of pixels within the tile are defective further includes: comparing a value obtained by dividing the absolute value by the standard deviation with a specified threshold value.

7. The cell-to-cell comparison method of claim 1, further comprising: displaying a defect result of determining whether the plurality of pixels within the tile are defective.

8. The cell-to-cell comparison method of claim 1, wherein, in the determining of the gray level of each of the plurality of pixels within the tile, the determined gray level includes noise.

* * * * *